US007755098B2

(12) United States Patent
Park et al.

(10) Patent No.: US 7,755,098 B2
(45) Date of Patent: Jul. 13, 2010

(54) ZINC OXIDE LIGHT EMITTING DIODE

(75) Inventors: Seong-Ju Park, Gwangju (KR);
Dae-Kue Hwang, Gwangju (KR);
Min-Ki Kwon, Gwangju (KR);
Min-Suk Oh, Gwangju (KR);
Yong-Seok Choi, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 12/419,706

(22) Filed: Apr. 7, 2009

(65) Prior Publication Data

US 2009/0256148 A1    Oct. 15, 2009

(30) Foreign Application Priority Data

Apr. 11, 2008    (KR) ............... 10-2008-0033554

(51) Int. Cl.
*H01L 33/00* (2010.01)
(52) U.S. Cl. ............... 257/98; 257/96; 257/103; 257/E33.019; 257/E33.055
(58) Field of Classification Search ............... None
See application file for complete search history.

(56) References Cited

U.S. PATENT DOCUMENTS

| 6,998,649 | B2 * | 2/2006 | Hata ............... 257/99 |
| 2005/0285128 | A1 * | 12/2005 | Scherer et al. ............... 257/98 |
| 2007/0181889 | A1 * | 8/2007 | Orita ............... 257/79 |
| 2008/0203899 | A1 * | 8/2008 | Miller et al. ............... 313/499 |
| 2008/0297027 | A1 * | 12/2008 | Miller et al. ............... 313/498 |
| 2009/0250685 | A1 * | 10/2009 | Moon ............... 257/13 |

OTHER PUBLICATIONS

Kock et al. Strongly directional emission from AlGaAs/GaAs light-emitting diodes. Nov. 26, 1990. Appl. Phys. Lett. vol. 57, No. 22. pp. 2327-2329.*
Kahen et al. Rigorous optical modeling of multilayer organic light-emitting diode devices. Mar. 19, 2001. Appl. Phys. Lett. vol. 78, No. 12. pp. 1649-1651.*

* cited by examiner

*Primary Examiner*—Andy Huynh
*Assistant Examiner*—Hoang-Quan T Ho
(74) *Attorney, Agent, or Firm*—Occhiuti Rohlicek & Tsao LLP

(57) ABSTRACT

Provided is a zinc oxide light emitting diode having improved optical characteristics. The zinc oxide light emitting diode includes an n-type semiconductor layer, a zinc oxide active layer formed on the n-type semiconductor layer, a p-type semiconductor layer formed on the active layer, an anode in electrical contact with the p-type semiconductor layer, a cathode in electrical contact with the n-type semiconductor layer, and a surface plasmon layer disposed between the n-type semiconductor layer and the active layer or between the active layer and the p-type semiconductor layer. Since the surface plasmon layer is formed between the n-type semiconductor layer and the active layer or between the active layer and the p-type semiconductor layer, the light emitting diode is not affected by an increase in resistance due to reduction of the thickness of the p-type semiconductor layer, and has improved optical characteristics due to a resonance phenomenon between the surface plasmon layer and the active layer.

4 Claims, 6 Drawing Sheets

ZINC OXIDE LIGHT EMITTING DIODE

CROSS-REFERENCE TO RELATED APPLICATION

This application claims the benefit of Korean Patent Application No. 2008-0033554, filed Apr. 11, 2008, the disclosure of which is hereby incorporated herein by reference in its entirety.

BACKGROUND OF THE INVENTION

1. Field of the Invention

The present invention relates to a zinc oxide light emitting diode, and more particularly, to a zinc oxide light emitting diode whose optical efficiency can be improved by using a surface plasmon phenomenon.

2. Description of the Related Art

Recently, a high-brightness white light emitting diode using zinc oxide semiconductor has been attracting considerable attention, and also has high economic value.

A high-brightness white light emitting diode is implemented by a method of producing white light by combining three light emitting diodes emitting three primary colors of light, i.e., red, green and blue, a method of producing white light by exciting a yellow phosphor using a blue light emitting diode as a light source, or a method of producing white light by exciting red, green and blue phosphors using an ultraviolet light emitting diode (UV LED) as a light source.

While research into white light emission continues, since green, blue and UV light emitting diodes used as a light source have poor efficiencies, the problem of increasing efficiencies of green, blue and UV light emitting diodes must be overcome in order to implement a white light emitting diode using a light source.

SUMMARY OF THE INVENTION

The present invention is directed to a zinc oxide light emitting diode having improved optical characteristics.

According to an exemplary embodiment of the present invention, a zinc oxide light emitting diode includes: an n-type semiconductor layer; a zinc oxide active layer formed on the n-type semiconductor layer; a p-type semiconductor layer formed on the active layer; an anode in electrical contact with the p-type semiconductor layer; a cathode in electrical contact with the n-type semiconductor layer; and a surface plasmon layer disposed between the n-type semiconductor layer and the active layer or between the active layer and the p-type semiconductor layer.

BRIEF DESCRIPTION OF THE DRAWINGS

These and/or other objects, aspects and advantages of the invention will become apparent and more readily appreciated from the following description of the exemplary embodiments, taken in conjunction with the accompanying drawings of which.

DETAILED DESCRIPTION OF THE INVENTION

Figure 1A:
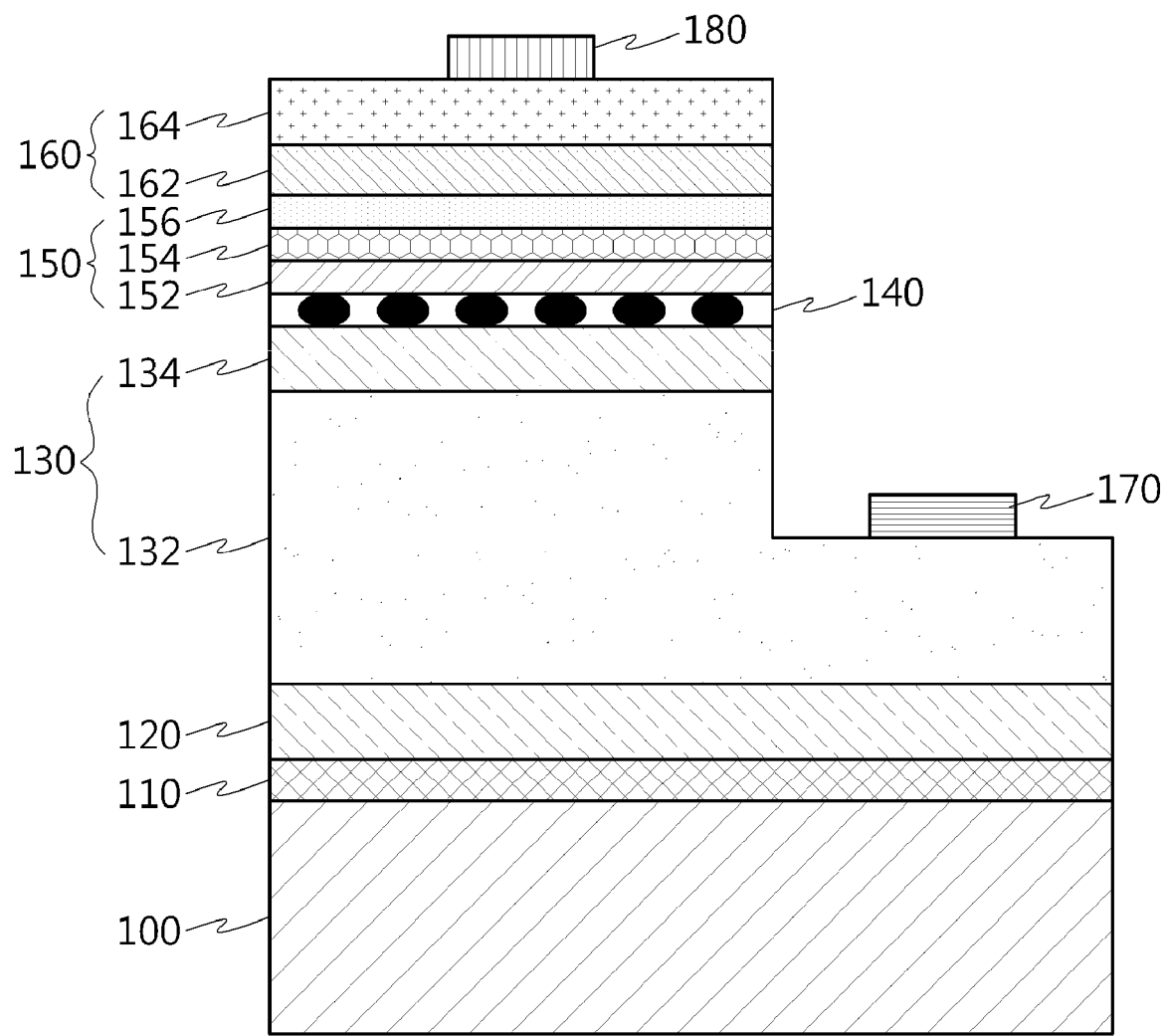
FIG. 1A is a schematic view showing a process of fabricating a light emitting diode according to an exemplary embodiment of the present invention.

The present invention will now be described more fully hereinafter with reference to the accompanying drawings, in which exemplary embodiments of the invention are shown. This invention may, however, be embodied in many different forms and should not be construed as limited to the exemplary embodiments set forth herein. Whenever elements appear in the drawings or are mentioned in the specification, they are always denoted by the same reference numerals.

FIG. 1A is a schematic view showing a process of fabricating a light emitting diode according to an exemplary embodiment of the present invention.

Referring to FIG. 1A, the light emitting diode according to an exemplary embodiment of the present invention may include a substrate 100, a buffer layer 110, a strain release layer 120, an n-type semiconductor layer 130, an active layer 150, a p-type semiconductor layer 160, a cathode 170 and an anode 180.

The substrate 100 may be formed of sapphire, SiC, GaAs, Si, glass, plastic or zinc oxide (ZnO).

The buffer layer 110 and the strain release layer 120 are sequentially formed on the substrate 100. The strain release layer 120 may be thicker than the buffer layer 110. The buffer layer 110 and the strain release layer 120 may be formed of $Mg_xZn_yCd_zO$ ($0 \leq x, y, z \leq 1$). The strain release layer 120 is formed to release or offset strain generated due to difference in crystal lattice structure from the substrate 100.

That is, when a thin film formed on the stain release layer 120 is a zinc oxide layer, the previously formed strain release layer 120 creates the effect of forming the thin film on the same kind of substrate, and thus the strain generated due to the difference in crystal lattice structure can be minimized.

The n-type semiconductor layer 130 may be formed on the strain release layer 120. The n-type semiconductor layer 130 may include an n-type contact layer 132 and an n-type clad layer 134, which are sequentially stacked.

The n-type contact layer 132 may be formed of $Mg_xZn_yCd_zO$ ($0 \leq x, y, z \leq 1$), and the n-type clad layer 134 may be a super-lattice layer of $Mg_xZn_yCd_zO$ ($0 \leq x, y, z \leq 1$) and $Mg_xZn_{1-x}O$ ($0 \leq x, y, z \leq 1$). The super-lattice layer has a structure in which several $Mg_xZn_yCd_zO$ ($0 \leq x, y, z \leq 1$) thin films having different compositions are stacked to a thickness at a nanometer level.

The n-type semiconductor layer 130 may be fabricated by doping the $Mg_xZn_yCd_zO$ ($0 \leq x, y, z \leq 1$) layer with Al, In or Ga.

A zinc oxide active layer 150 may be formed on the n-type semiconductor layer 130. The active layer 150 may include a first barrier layer 152, a well layer 154 and a second barrier layer 156. Preferably, the first barrier layer 152 may be formed of $Mg_xZn_yCd_zO$ ($0 \leq x, y, z \leq 1$), and the well layer 154 may be formed in a single or multiple quantum well structure of $Mg_xZn_yCd_zO$ ($0 \leq x, y, z \leq 1$). The second barrier layer 156 may be formed of $Mg_xZn_yCd_zO$ ($0 \leq x, y, z \leq 1$).

The single quantum well structure includes the first barrier layer 152, the well layer 154 and the second barrier layer 156, and the multiple quantum well structure has a structure in which another single quantum well structure is stacked on the single quantum well structure formed of a sequential stack of the first barrier layer 152, the well layer 154 and the second barrier layer 156.

The p-type semiconductor layer 160 may be formed on the active layer 150. The p-type semiconductor layer 160 may include a p-type clad layer 162 and a p-type contact layer 164, which are sequentially stacked.

The p-type contact layer 164 may be formed of $Mg_xZn_yCd_zO$ ($0 \leq x, y, z \leq 1$), and the p-type clad layer 162 may be a super-lattice layer of $Mg_xZn_yCd_zO$ ($0 \leq x, y, z \leq 1$) and $Mg_xZn_{1-x}O$ ($0 \leq x, y, z \leq 1$).

The p-type semiconductor layer 160 may be formed by doping the $Mg_xZn_yCd_zO$ ($0 \leq x, y, z \leq 1$) layer with N, P, As or Sb.

Here, the strain release layer 120, the n-type clad layer 134, the p-type clad layer 162 can be omitted, and thus the active layer 150 may be formed between the n-type contact layer 132 and the p-type contact layer 164.

The cathode 170 and the anode 180 are formed for electrical connection of the light emitting diode.

The anode 180 may be formed at a portion in electrical contact with the p-type semiconductor layer 160, and the cathode 170 may be formed at a portion in electrical contact with the n-type semiconductor layer 130.

For example, the active layer 150 may be formed on a side of the n-type semiconductor layer 130, and the cathode 170 may be formed on a side on which the active layer 150 is not formed.

Meanwhile, the surface plasmon layer 140 may be formed between the n-type semiconductor layer 130 and the active layer 150 or between the active layer 150 and the p-type semiconductor layer 160.

That is, since the active layer 150 can include the first barrier layer 152, the well layer 154 and the second barrier layer 156, the surface plasmon layer 140 may be formed between the n-type semiconductor layer 130 and the first barrier layer 152, or between the second barrier layer 156 and the p-type semiconductor layer 160.

The surface plasmon layer 140 may be formed of one selected from the group consisting of gold, silver, aluminum and copper, and the surface plasmon layer 140 may be formed using an electron beam evaporator, a sputter or a plasma laser deposition apparatus. The surface plasmon layer 140 may be formed to a thickness ranging from 0.1 to 500 nm.

Since a basic atomic size of the metal is about 0.1 to 0.3 nm, it can be difficult to form the surface plasmon layer 140 to have a thickness of 0.1 nm or less. Further, when the surface plasmon layer 140 is formed to a thickness of 500 nm or more, which is too thick, it also can be difficult to form another thin film on the surface plasmon layer 140, and to transmit light emitted from the active layer 150 through the surface plasmon layer 140.

The barrier layers 152 and 156 are preferably formed to a thickness of 80 nm or less to generate a surface plasmon.

The substrate 100 and the buffer layer 110 may be removed after the light emitting diode is completed as described above.

Figure 1B:
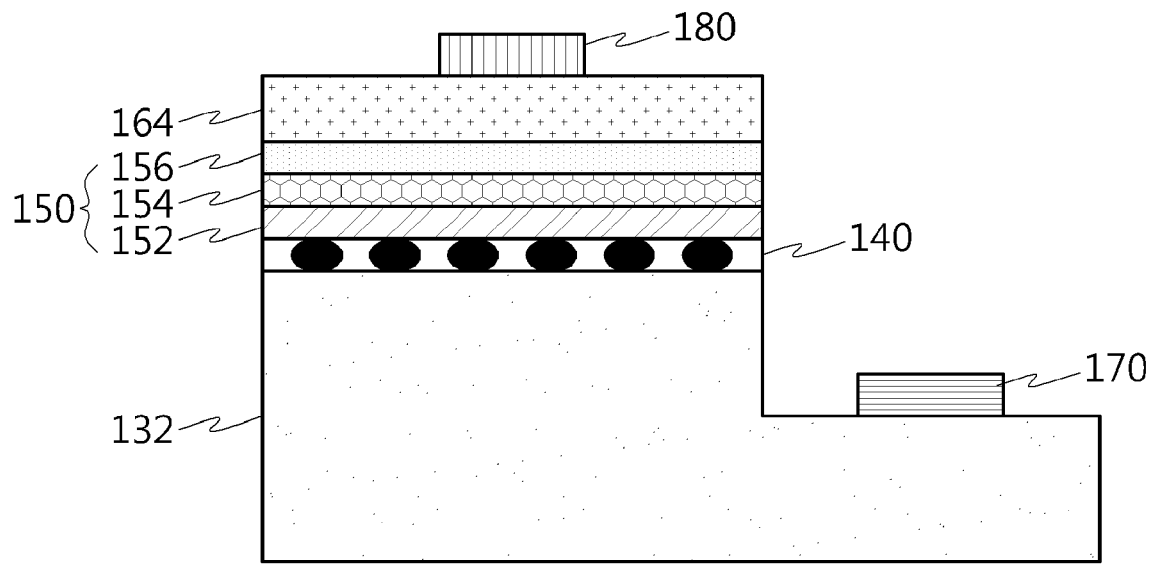
FIG. 1B is a cross-sectional view of the light emitting diode according to an exemplary embodiment of the present invention.
Figure 1C:
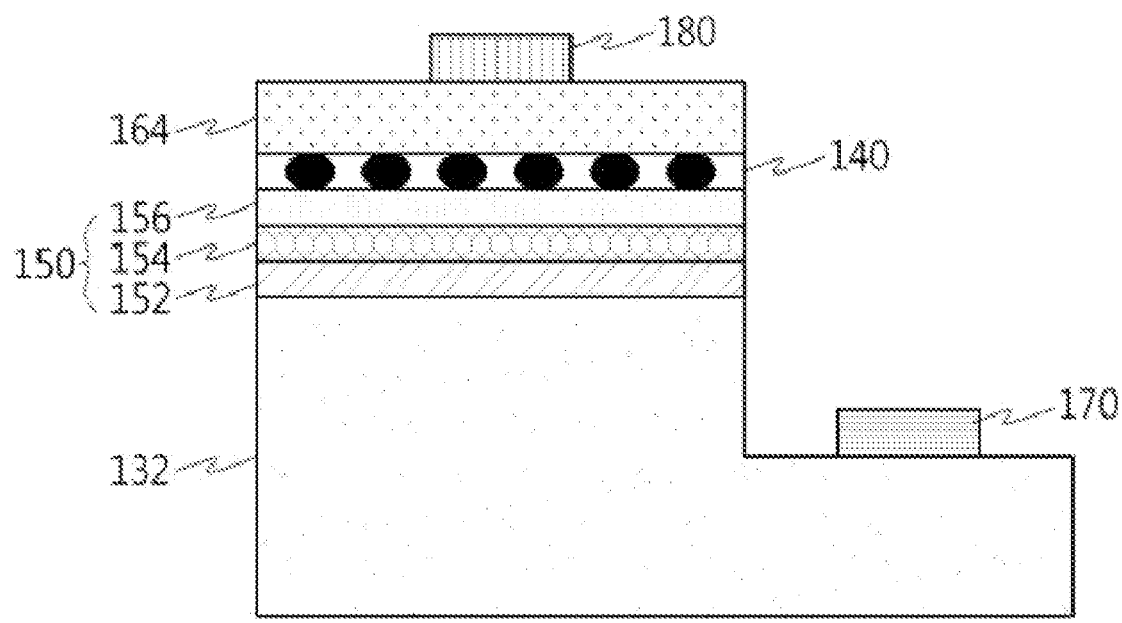
FIG. 1C is a cross-sectional view of a light emitting diode according to another exemplary embodiment of the present invention.

FIG. 1B is a cross-sectional view of the light emitting diode according to an exemplary embodiment of the present invention, and FIG. 1C is a cross-sectional view of a light emitting diode according to another exemplary embodiment of the present invention.

The light emitting diodes according to the present exemplary embodiments may be similar to the exemplary embodiment explained with reference to FIG. 1A, except for the differences described below.

Referring to FIG. 1B, the light emitting diode according to an exemplary embodiment of the present invention may not include a substrate 100, a buffer layer 110, a strain release layer 120, an n-type clad layer 134 and a p-type clad layer 162.

Thus, the light emitting diode fabricated according to an exemplary embodiment of the present invention may be formed by sequentially stacking an n-type contact layer 132, a surface plasmon layer 140, an active layer 150 and a p-type contact layer 164. An anode 180 may be formed at a portion in electrical contact with the p-type contact layer 164, and a cathode 170 may be formed at a portion in electrical contact with the n-type contact layer 132.

Referring to FIG. 1C, the surface plasmon layer 140 may be formed between the n-type contact layer 132 and the active layer 150, or between the active layer 150 and the p-type contact layer 164.

When the surface plasmon layer 140 is formed between the n-type contact layer 132 and the active layer 150, or between the p-type contact layer 164 and the active layer 150, resonance or coupling can occur between a plasmon generated from the surface plasmon layer 140 and an exciton in the active layer 150. Thus, the life span of the exciton may be reduced in the active layer 150 and more carriers may participate in luminous coupling for a short time, so that optical efficiency can be improved.

The above-described structure can reduce a surface plasmon effect occurring as a distance between a surface of the surface plasmon layer 140 and the active layer 150 is increased, and can eliminate an increase in electrical resistance generated due to a decrease in thickness of the p-type semiconductor layer 130 for achieving the surface plasmon effect when the surface plasmon layer 140 is formed on the p-type semiconductor layer 130.

Figure 2A:
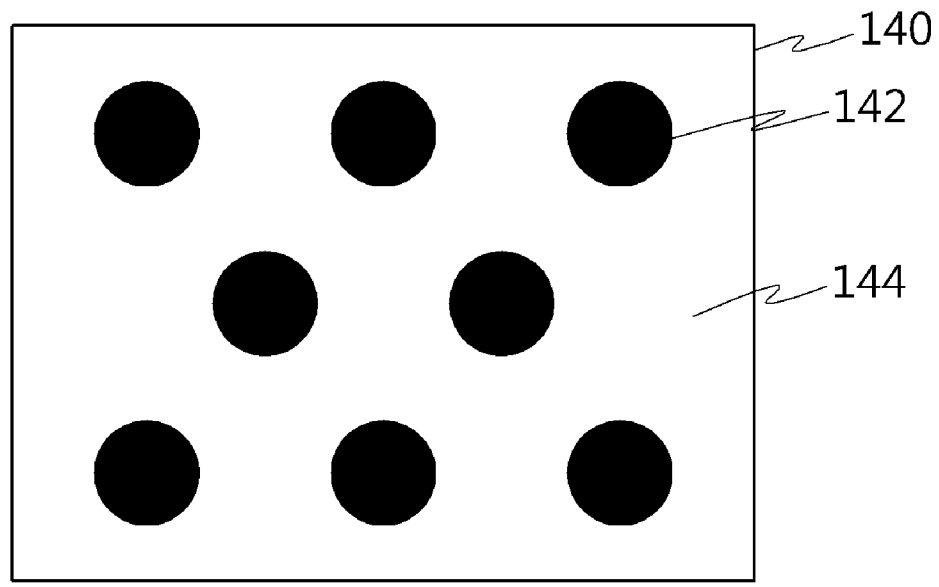
FIGS. 2A to 2C are plan views showing structures of a surface plasmon layer according to an exemplary embodiment of the present invention.
Figure 2B:
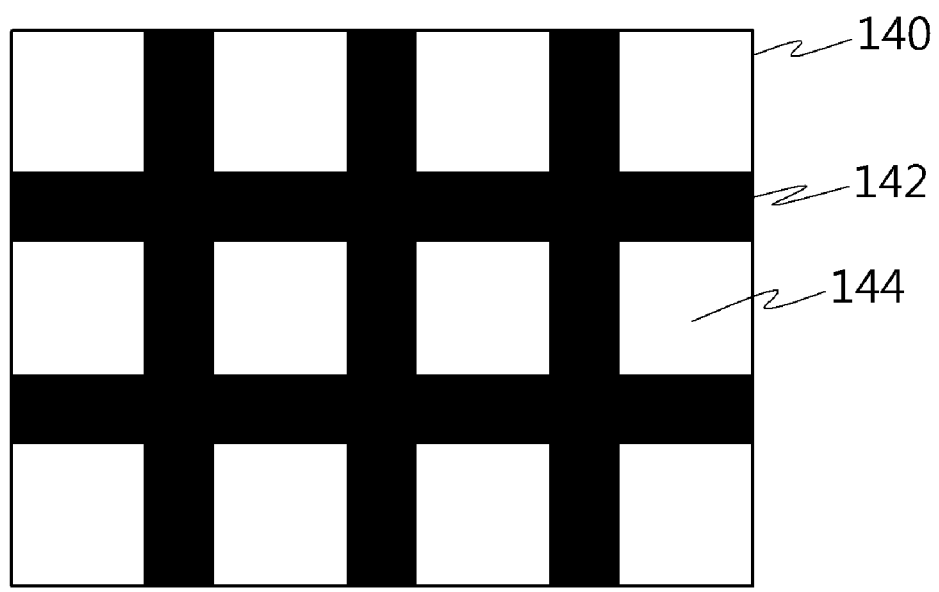
Figure 2C:
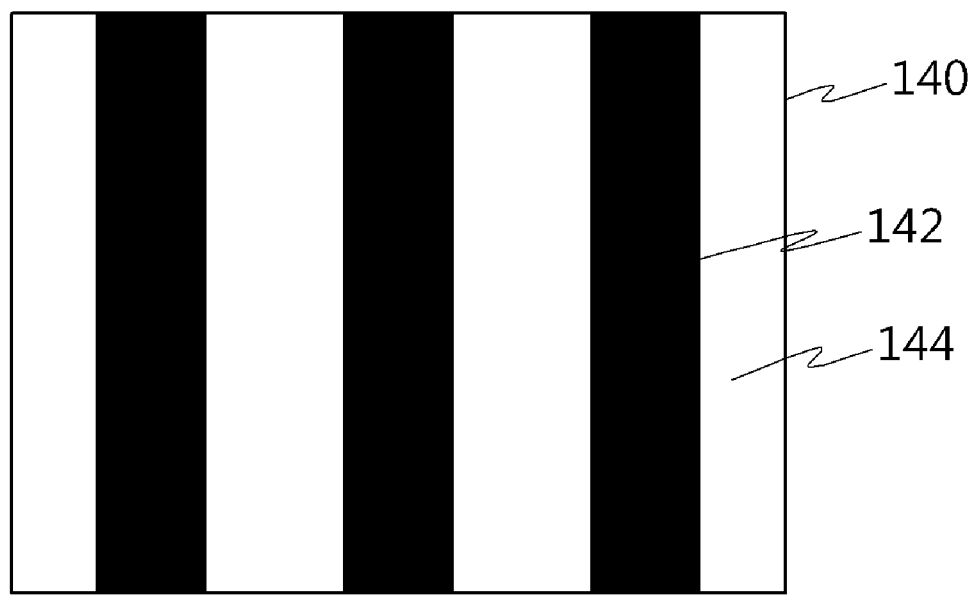

FIGS. 2A to 2C are plan views of structures of a surface plasmon layer according to an exemplary embodiment of the present invention.

Referring to FIG. 2A, the surface plasmon layer 140 may be formed in an uneven structure having an island shape as shown in FIG. 2A. A droplet-shaped metal 142 may be formed on the surface plasmon layer 140, and then a portion of the surface plasmon layer 140 on which the metal 142 is not formed may be filled with zinc oxide or an inorganic or organic material 144.

Referring to FIG. 2B, the surface plasmon layer 140 may be formed in an uneven structure having a mesh shape. A mesh-shaped metal 142 is formed on the surface plasmon layer 140, and then a portion on which the metal 142 is not formed may be filled with zinc oxide or an inorganic or organic material 144.

Referring to FIG. 2C, the surface plasmon layer 140 may be formed in an uneven structure having a linear shape. A linear-shaped metal is formed, and then a portion on which the metal 142 is not formed may be filled with zinc oxide or an inorganic or organic material 144.

As shown in FIGS. 2A to 2C, since the surface plasmon layer 140 is divided into a portion where metal is formed and a portion where metal is not formed, plasmons can be localized only at the portion where metal is formed. The localized plasmons can be further effectively coupled to excitons in the active layer. Thus, since the life span of a carrier may be reduced and more carriers may participate in luminous coupling for a short time, optical efficiency can be improved.

Figure 3A:
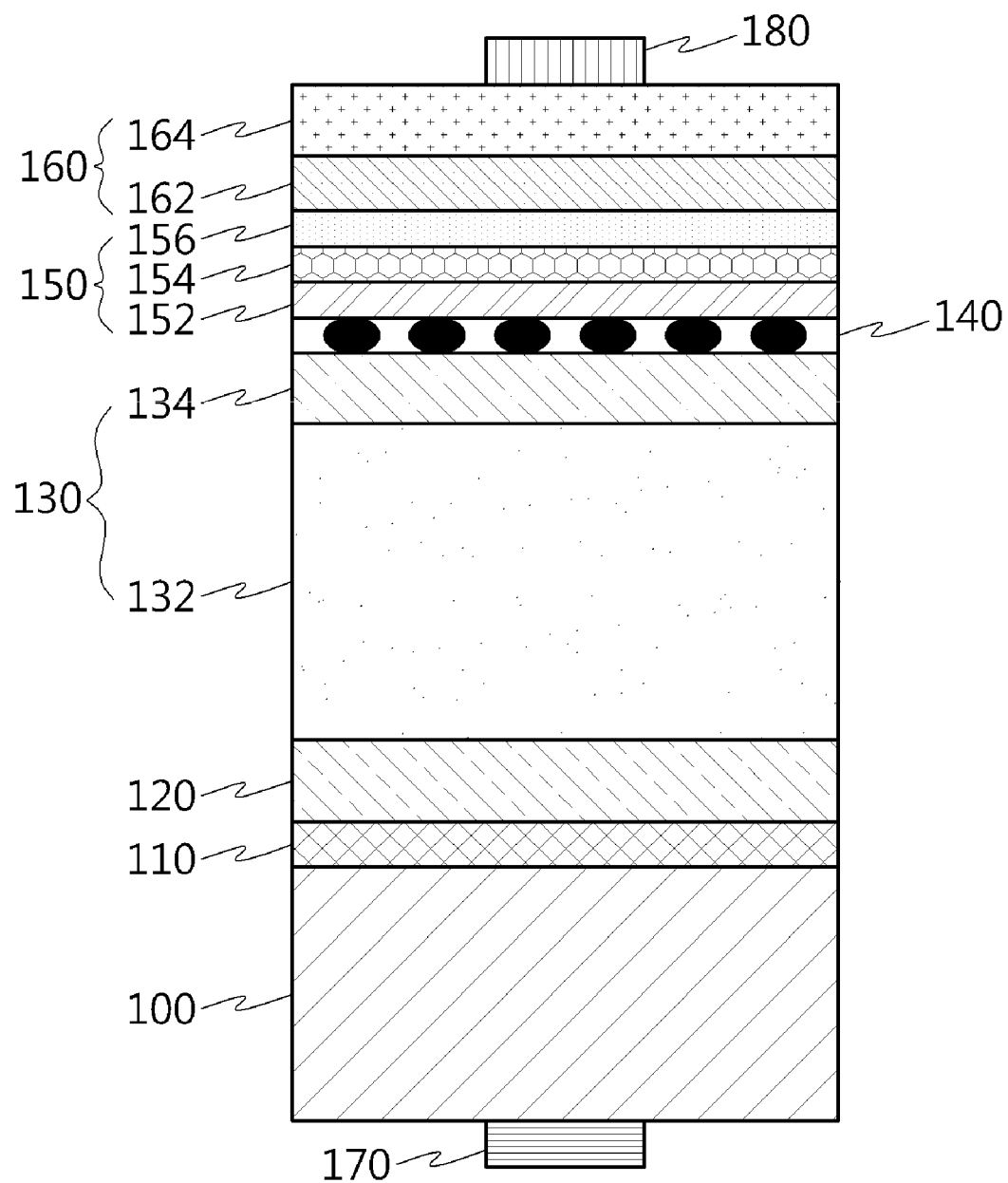
FIG. 3A is a schematic view showing a process of fabricating a light emitting diode according to another exemplary embodiment of the present invention.
Figure 3B:
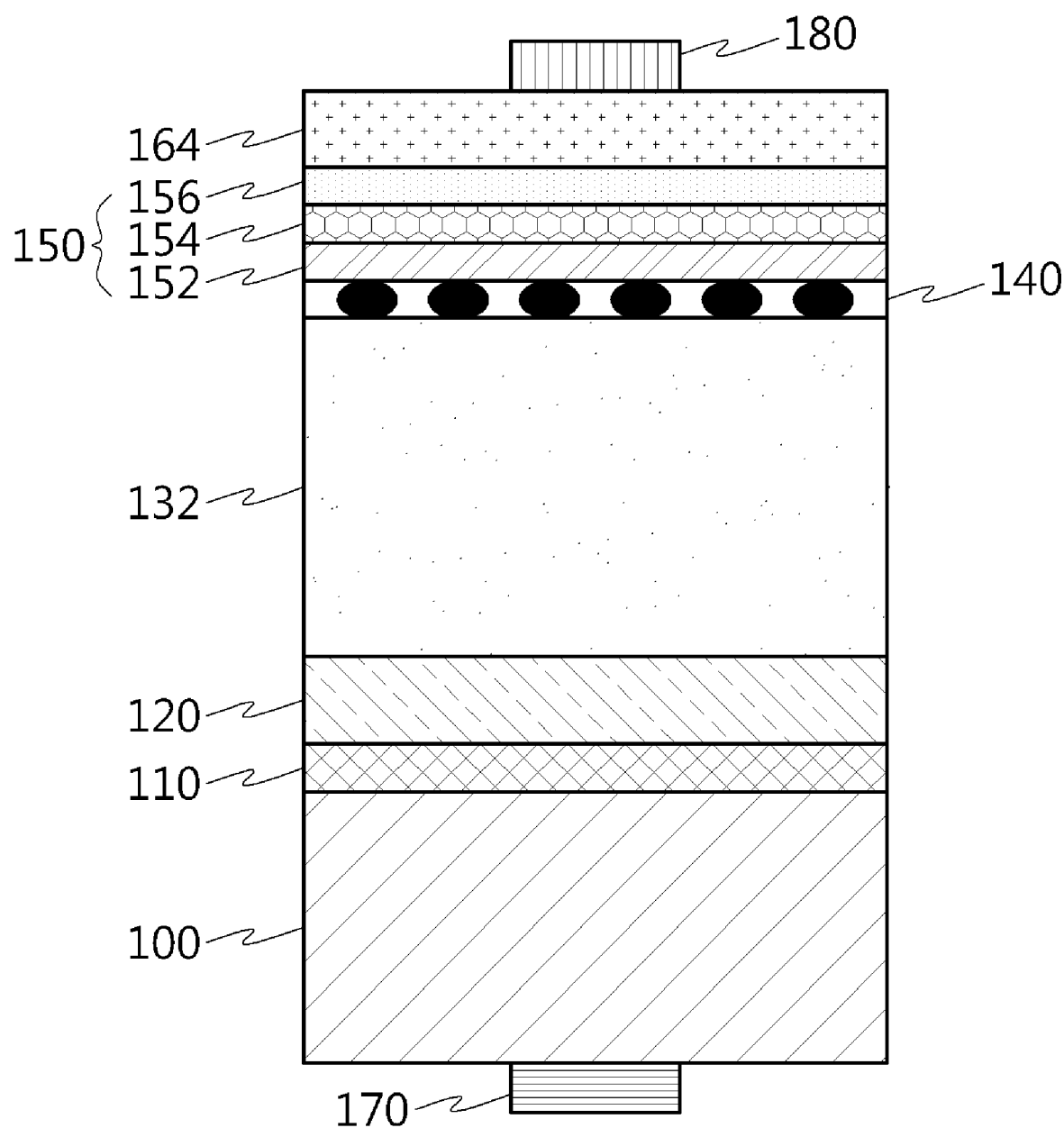
FIG. 3B is a cross-sectional view of the light emitting diode according to another exemplary embodiment of the present invention.

FIG. 3A is a schematic view showing a process of fabricating a light emitting diode according to another exemplary embodiment of the present invention, and FIG. 3B is a cross-sectional view of the light emitting diode according to another exemplary embodiment of the present invention. The light emitting diode according to another exemplary embodiment of the present invention may be similar to the exemplary embodiments explained with reference to FIGS. 1A to 1C, except for the differences described below.

Referring to FIG. 3A, as described above with reference to FIGS. 1A to 1C, a substrate 100, a buffer layer 110, a strain release layer 120, an n-type semiconductor layer 130, an active layer 150, a p-type semiconductor layer 160, a cathode 170 and an anode 180 may be formed, and a surface plasmon layer 140 may be further formed between the n-type semiconductor layer 130 and the active layer 150 or between the active layer 150 and the p-type semiconductor layer 160. The n-type semiconductor layer 130 may include an n-type contact layer 132 and an n-type clad layer 134, which are sequentially stacked, and the p-type semiconductor layer 160 may include a p-type clad layer 162 and a p-type contact layer 164, which are sequentially stacked.

The n-type clad layer 134 or the p-type clad layer 162 may be omitted. When the substrate 100 is formed of doped zinc oxide, the cathode 170 may be formed on the substrate 100, and thus the buffer layer 110 may be omitted. The buffer layer 110 may be formed of $Mg_xZn_yCd_zO$ ($0 \leq x, y, z \leq 1$) or undoped $Mg_xZn_yCd_zO$ ($0 \leq x, y, z \leq 1$).

Referring to FIG. 3B, a substrate 100, a strain release layer 120, an n-type contact layer 132, an active layer 150 and a p-type contact layer 164 are sequentially stacked. An anode 180 is formed at a portion in electrical contact with the p-type contact layer 164, and a cathode 170 is formed at a portion in electrical contact with the substrate 100. Here, the substrate 100 may be formed of doped zinc oxide.

According to the present invention described above, as a surface plasmon layer is formed between an n-type semiconductor layer and an active layer or between a p-type semiconductor layer and an active layer, resonance or coupling between a plasmon generated from the surface plasmon layer and an exciton in the active layer can occur. Thus, the life span of the exciton in the active layer is decreased, and more carriers participate in luminous coupling for a short time, resulting in improvement of optical efficiency.

Further, since the surface plasmon layer is in direct contact with the active layer, a surface plasmon effect generated due to an increase in distance between a surface of the surface plasmon layer and the active layer can be reduced, and an increase in electrical resistance generated due to reduction of the thickness of the p-type semiconductor layer for achieving the surface plasmon effect when the surface plasmon layer is formed on the p-type semiconductor layer can be eliminated.

While exemplary embodiments of the present invention have been shown and described, it will be appreciated by those skilled in the art that various changes can be made to the described exemplary embodiments without departing from the spirit and scope of the invention defined by the claims and their equivalents.

What is claimed is:

1. A zinc oxide light emitting diode, comprising:
   an n-type semiconductor layer;
   a zinc oxide active layer formed on the n-type semiconductor layer;
   a p-type semiconductor layer formed on the active layer;
   an anode in electrical contact with the p-type semiconductor layer;
   a cathode in electrical contact with the n-type semiconductor layer; and
   a surface plasmon layer disposed between the n-type semiconductor layer and the active layer or between the active layer and the p-type semiconductor layer.

2. The zinc oxide light emitting diode according to claim 1, wherein the surface plasmon layer contains one selected from the group consisting of gold, silver, aluminum and copper.

3. The zinc oxide light emitting diode according to claim 2, wherein the surface plasmon layer is formed in an island, mesh or linear shape.

4. The zinc oxide light emitting diode according to claim 1, wherein the n-type semiconductor layer includes an n-type contact layer and an n-type clad layer, which are sequentially stacked, and the p-type semiconductor layer includes a p-type clad layer and a p-type contact layer, which are sequentially stacked.

* * * * *